(12) United States Patent
Lee et al.

(10) Patent No.: US 7,416,930 B2
(45) Date of Patent: Aug. 26, 2008

(54) METHOD FOR PRODUCING AN OXIDE CONFINED SEMICONDUCTOR LASER

(75) Inventors: Borlin Lee, Hsin-chu (TW); Chun-Han Wu, Hsin-chu (TW); Jin-Shan Pan, Hsin-chu (TW); Hung-Ching Lai, Hsin-chu (TW)

(73) Assignee: True Light Corporation, Hsin-Chu (TW)

( * ) Notice: Subject to any disclaimer, the term of this patent is extended or adjusted under 35 U.S.C. 154(b) by 44 days.

(21) Appl. No.: 11/302,280

(22) Filed: Dec. 14, 2005

(65) Prior Publication Data

US 2006/0126696 A1    Jun. 15, 2006

(30) Foreign Application Priority Data

Dec. 15, 2004    (TW) ............................... 93138837 A (51) Int. Cl.
*H01L 21/336* (2006.01)
*H01L 21/8234* (2006.01)
*H01L 21/4763* (2006.01)

(52) U.S. Cl. .................. 438/197; 438/298; 438/623; 438/645

(58) Field of Classification Search ............ 372/50.124; 438/623, 628, 631, 644, 645, 197, 298
See application file for complete search history.

(56) References Cited

U.S. PATENT DOCUMENTS 6,570,905 B1    5/2003    Ebeling

| 6,645,848 B2 | 11/2003 | Joseph et al. |
| 6,658,040 B1 | 12/2003 | Hu et al. |
| 6,687,268 B2 * | 2/2004 | Kitamura et al. ............. 372/22 |
| 2003/0123502 A1 | 7/2003 | Biard et al. |

FOREIGN PATENT DOCUMENTS

| TW | 130588(427045) | 3/2001 |
| TW | 192770(565975) | 12/2003 |
| TW | 580785 | 3/2004 |

\* cited by examiner

*Primary Examiner*—Chuong A. Luu (57) ABSTRACT

A method for producing an oxide confined semiconductor laser uses a dual platform to synchronously produce a light emitting active area and a wire bonding area on a semiconductor material and use a metal protective material, an electrically conductive metal material, and a dielectric material together with an etching process, an oxide confined technology, and plating technology to produce the dual platform, an oxide layer, a dielectric layer, a protective layer, and a metal layer. The light emitting active area platform and the wire bonding area platform are independent, and the wire bonding area platform is produced on the semiconductor structure, such that an ion implant process can adjust the capacitance and provide a higher wire bonding strength. Since the electric layer is filled on the external sides of the dual platforms, the wire connected metal capacitance is lowered, and the planarization facilitates the production of the metal layer.

23 Claims, 9 Drawing Sheets

METHOD FOR PRODUCING AN OXIDE CONFINED SEMICONDUCTOR LASER

BACKGROUND OF THE INVENTION

1. Field of the Invention

The present invention relates to a method for producing an oxide confined semiconductor laser that involves a vertical-cavity surface emitting laser (VCSEL) technology and its manufacturing process, and more particularly to a vertical-cavity surface emitting laser device and its manufacturing method that directly construct a light emitting active area and a wire bonding area on the structure of a semiconductor material by a dual platform method.

2. Description of Prior Art

Optical information and communication systems provide a major method for moving huge data in a high speed, and one of the main components of such optical information and communication systems is an optical transceiver. At the data transmitting end, an optical transceiver is provided for translating a data in the form of electric signals (such as a digital data in the form of 0 and 1) into an optical signal which is suitable to be transmitted by a transmission medium (such as an optical fiber cable). At the data receiving end, the optical transceiver translates the received optical signal back into a data in the form of electric signals. One of the major components of the foregoing optical transmitter is an optical transmitter for transmitting optical data, and typical optical transmitters for the preferred embodiment are light emitting diode (LED) and semiconductor laser diode (LASER), wherein the semiconductor laser diode (LASER) has a higher transmission speed, and thus becoming the subject for main development and applications of the present optical communication system.

Most of the present optical transmitters used for optical information communication systems are surface emitting semiconductor laser diode (LASER) such as the vertical-cavity surface emitting laser (VCSEL). As its name suggests, the laser beam is emitted vertically from the surface of the component, characterized in that the upper and lower Distributed Bragg Reflectors (DBR) are used to define a laser cavity. Unlike the edge emitting laser, the surface emitting laser omits the complicated process of producing laser mirrors of the edge emitting laser by the cracking and dry etching methods. Furthermore, the vertical-cavity surface emitting laser (VCSEL) has the following advantages:

(1) The low scattered circular laser beam is coupled to the optical fiber easily.

(2) The VCSEL has a high speed modulation function that facilitates high speed optical fiber network transmissions.

(3) The manufacturing process technology of components is suitable for mass production.

(4) Before the epitaxy is cut and packaged, the properties of each crystal grain of the whole wafer are tested by the wafer-lever testing, and thus it incurs a lower cost.

(5) A one-dimensional (1D) or two-dimensional (2D) laser matrix can be produced for facilitating a serial or parallel optical fiber transmission.

The structure of a vertical-cavity surface emitting laser (VCSEL) is generally divided into four types: Etched Air-Post, Ion Implanted, Regrowth Buried Heterostruture, and Oxide Confined, and most commercial products adopt the Ion Implanted type, because its manufacturing process is simple and suitable for mass production. However, when the ion implant technology is used, its implant area cannot be too close to the active layer of the surface emitting laser, otherwise the high-energy particles may destroy the material of the active layer and deteriorate the properties of the laser components, and thus the ion-implant vertical-cavity surface emitting laser (VCSEL) is not suitable for high frequency operations. Therefore, the commercial laser products tend to be developed as oxide confined vertical-cavity surface emitting lasers (VCSEL), whose properties are better than those of the ion implant lasers mainly because its light emitting active area is narrower, and thus obtaining a lower critical current, and a high-quantum efficient and low critical voltage. As to the oxide confined technology, an aluminum gallium arsenide (AlGaAs) with a high aluminum content is introduced adjacent to the active layer and selectively etched to expose it in a high-temperature water vapor, and then the AlGaAs layer with a high aluminum content will be converted into an insulating aluminum oxide dielectric layer to achieve the effect of confining currents and photons. However, its shortcoming resides on that the level of difficulty of the related technology is higher. After a device is selectively etched, the device will have a non-planarized surface which may produce a crack and cause a poor yield rate of the device, when the metal electrode is produced on a non-planarized surface.

To respond to the existing shortcomings of the foregoing oxide confined vertical-cavity surface emitting laser (VCSEL), different manufacturing methods are developed to produce VCSEL, such as those disclosed in U.S. Pat. Publication No. 2003/0123502 (R.O.C. Pat. Publication No. 200306043), U.S. Pat. No. 6,658,040 (R.O.C. Pat. No. 151547), and R.O.C. Pat. No. 192770. These patented technologies mainly adopt a trench oxide confined technology to produce the VCSEL, and thus the requirements for the etching equipments will be higher, and the inductively coupled plasma (ICP) etching system must be used. Of course, the equipments and manufacturing costs will be more expensive. Further, U.S. Pat. Nos. 6,645,848 and 6,570,905, R.O.C. Pat. No. 130588, and R.O.C. Pat. Publication No. 580785 disclosed the methods of producing VCSEL by an oxide confined platform. It is worth to point out that the technical contents related to oxide confined vertical-cavity surface emitting lasers (VCSEL) and disclosed in these prior-art patented technologies adopt the single-platform semiconductor as the basic architecture to build the light emitting active area of the vertical-cavity surface emitting laser (VCSEL).

It is worth to note that U.S. Pat No. 6,645,848 issued to John R. Joseph, et al, U.S. Pat. No. 6,658,040 (R.O.C. Pat. No. 151547) issued to Syn-Yem Hu et al, and U.S. Pat. No. 6,570,905 issued to Karl Joachim Ebeling disclosed the same foregoing methods of using a single-platform semiconductor as the basic architecture to build the light emitting active area of the vertical-cavity surface emitting laser (VCSEL) and further using a dielectric material to fill a metal layer after the light emitting active area is produced, so as to create a wire bonding area electrically coupled to the light emitting active area. However, the wire bonding area created by filling a dielectric material has a weaker mechanical stress due to the properties of the dielectric material. As a result, films often cracks during the wire bonding process, and the effect of the wire bonding will be affected adversely, or even worse, the wire bonding cannot be completed.

SUMMARY OF THE INVENTION

The present invention is to provide a method for producing an oxide confined semiconductor laser that forms two independent platforms defined as a light emitting area platform and a wire bonding platform directly on the structure of a laser semiconductor material. In the architecture of the two independent platforms, an oxide layer, a dielectric layer, a SiN protective layer, and a metal layer are formed to produce an oxide confined dual platform vertical-cavity surface emitting laser (VCSEL).

Another, the present invention is to provide a method for producing an oxide confined semiconductor laser that uses the architecture of a dual platform light emitting active area and a wire bonding area to build the oxide confined semiconductor laser directly on a laser semiconductor material to produce independent light emitting active area platform and wire bonding area platform, so as to independently design the structures of the light emitting active area platform and the wire bonding area platform.

Further, the present invention is to provide a method for producing an oxide confined semiconductor laser that independently produces a wire bonding area platform on a semiconductor structure and uses an ion implant process to adjust the capacitance and obtain a higher mechanical stress for the wire bonding process.

Another further, the present invention is to provide a method for producing an oxide confined semiconductor laser that uses a dielectric material to fill the external sides of a dual platform to produce a dielectric layer, so as to obtain a planarized surface and facilitate building a metal layer on the light emitting active area platform and the wire bonding area platform, and lower the connected wire metal capacitance.

A method for producing an oxide confined semiconductor laser in accordance with the present invention comprises the steps of providing a laser chip layer (VCSEL), defining a dual platform production area on the surface of the laser chip layer, producing a light emitting active area platform and a wire bonding area platform, producing a dual platform oxide layer, producing a dielectric layer at the peripheries of a light emitting active area platform with an oxide layer and a wire bonding area platform, producing a protective layer, producing a metal layer to form a light emitting active area platform disposed at a pad of the wire bonding area platform and producing a bottom electrode layer (with a cathode layer) and completing the production of the oxide confined dual platform vertical-cavity surface emitting laser (VCSEL).

An oxide confined semiconductor laser (VCSEL) produced by the method of the present invention, comprises a laser chip layer (VCSEL), a bottom electrode layer (with a cathode layer), coupled to the laser chip layer, a light emitting active area platform, disposed at the laser chip layer (VCSEL), a wire bonding area platform, disposed at the laser chip layer (VCSEL), an oxide layer, forming an insulating area at the light emitting active area platform and the wire bonding area platform, a dielectric layer filled in the peripheries and planes of the light emitting active area platform and the wire bonding area platform, a protective layer disposed at the surface of the dielectric layer, and having a contact area hole at a position corresponding to the light emitting active area platform and a pad extended to the wire bonding area platform as a base to form the light emitting active area platform and serving as a P electrode layer.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The technical characteristics, features and advantages of the dual platform semiconductor laser device in accordance with the present invention will become apparent in the following detailed description of the preferred embodiments with reference to the accompanying drawings.

Figure 1:
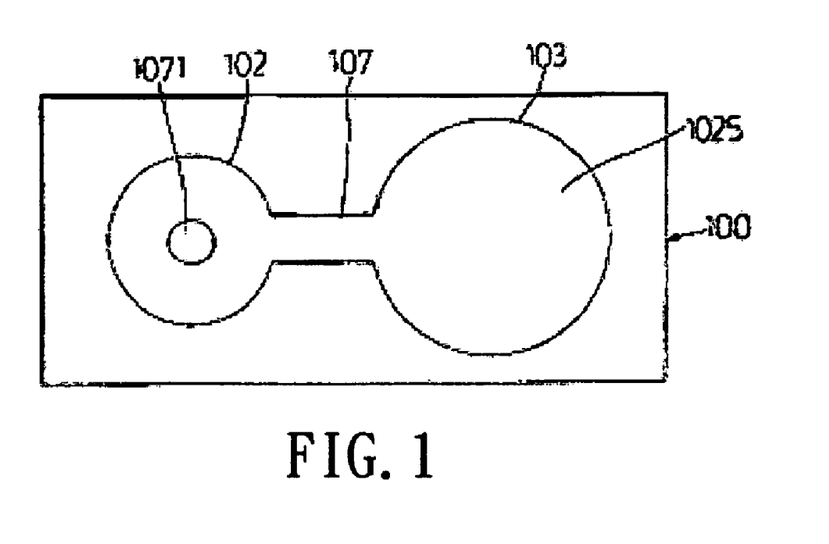
FIG. 1 is a lateral cross-sectional view of a VCSEL according to a preferred embodiment of the present invention.
Figure 2:
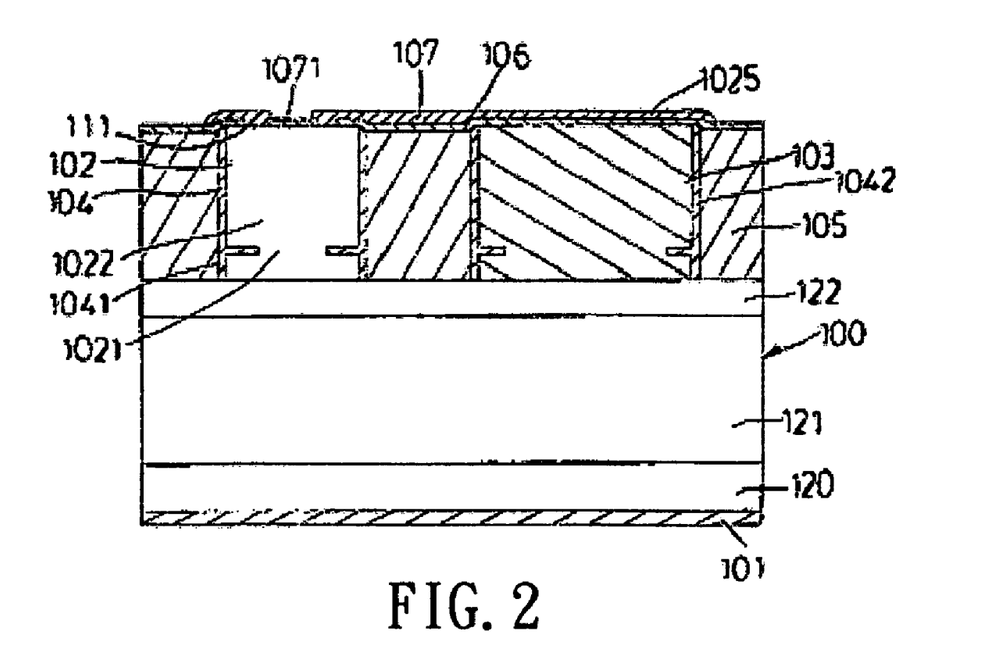
FIG. 2 is a top view of a VCSEL according to a preferred embodiment of the present invention.

Referring to FIGS. 1 and 2 for the lateral cross-sectional view and the top view of producing an oxide confined semiconductor laser (VCSEL) according to the method of the present invention, the oxide confined semiconductor laser (VCSEL) in accordance with a preferred embodiment of the present invention comprises a laser chip layer (VCSEL) 100, a bottom electrode layer 101 (with a cathode layer), a light emitting active area platform 102, a wire bonding area platform 103, an oxide layer 104, a dielectric layer 105, a protective layer 106 having a contact area hole 111, and a metal layer 107. From the bottom up, a bottom electrode layer 101, a laser chip layer (VCSEL) 100, a light emitting active area platform 102, a wire bonding area platform 103, an oxide layer 104 forming an insulating area at the exteriors of the light emitting active area platform 102 and the wire bonding area platform 103, a dielectric layer 105, a protective layer 106, and a metal layer 107 are formed.

In a preferred embodiment of the present invention, The laser chip layer (VCSEL) 100 comprises a substrate 120, a continuous expitary grown at a first distributed Bragg reflector 121 at a distal surface of the substrate 120, an active layer 122, and a second distributed Bragg reflector 123. The second distributed Bragg reflector 123 in a dual platform works with a photoresist material to define and produce a light emitting active area platform 102 and a wire bonding area platform 103.

The light emitting active area platform 102 and the wire bonding area platform 103 produced synchronously on the laser chip layer (VCSEL) 100 works together with an oxide layer 104 disposed between the exteriors of the light emitting active area platform 102 and the wire bonding area platform 103 to form an oxide confined hole 1021, 1031 having an insulating area, so as to produce the structure of a light emitting active area 1022 disposes at the light emitting active area platform 102 that correspond to an active layer 122 of a light producing area to carry out a vertical light emission.

The oxide layer 104 in accordance with the preferred embodiment adopts an isolable barrier preferably an insulating area formed by an oxidizing material in an oxidation process. However, the oxide layer 104 could be any isolable barrier including an isolable material, or an isolable barrier made of a material for forming an insulating area and a platform 102, 103 with an oxide confined hole 1021, 1031.

The dielectric layer 105 is filled on the laser chip layer (VCSEL) 100 and the peripheries of the light emitting active area platform 102 and the wire bonding area platform 103, so as to obtain a planarized surface easily for forming and coupling the protective layer 106 and the metal layer 107 at the surfaces of the light emitting active area platform 102 and the wire bonding area platform 103. By the filling of the dielectric layer 105, the connected wire metal capacitance of the light emitting active area platform 102 and the wire bonding area platform 103 can be lowered.

The protective layer 106 plated on the surface of the dielectric layer 105 is formed to protect the surface of the dielectric layer 105. The protective layer 106 at its distal surface includes a contact area hole 111 at a position corresponding to the light emitting active area 1022 of the light emitting active area platform 102, which is used for contacting the electrodes of the metal layer 107.

The metal layer 107 is built on the surface of the dielectric layer 105 and electrically coupled to a P electrode layer (with an anode layer) of the light emitting active area platform 102. The metal layer 107 is disposed at an end of the first independent platform 102 and includes a light emitting hole 1071. In the meantime, the metal layer 107 is penetrated through the contact area hole 111 and coupled to the top surface of the first independent platform 102, and the metal layer 107 uses the area of the wire bonding area platform 103 as a basis to form a pad 1025 of a P electrode layer extended from the light emitting active area platform 102.

Refer to FIGS. 3 to 20 for the method for producing an oxide confined semiconductor laser. In FIGS. 1 and 2, the flow of producing a bottom electrode layer 101, a light emitting active area platform 102, a wire bonding area platform 103, an oxide layer 104, a dielectric layer 105, a protective layer 106, and a metal layer 107 is given.

Referring to FIGS. 3 to 20 for the flow of a method of producing an oxide confined semiconductor laser in accordance with the present invention, the method comprises the steps of:

1. providing a laser chip layer (VCSEL);
2. defining a dual platform production area on the laser chip layer (VCSEL);
3. producing a light emitting active area platform and a wire bonding area platform on the dual platform production area;
4. producing a dual platform oxide layer;
5. producing a dielectric layer at the peripheries of the light emitting active area platform and the wire bonding area platform;
6. producing a protective layer on the surface of the dielectric layer;
7. producing a metal layer and forming a light emitting active area platform at a pad of the wire bonding area platform;
8. producing a bottom electrode layer (with a cathode layer), and completing the production of the oxide confined dual platform vertical-cavity surface emitting laser (VCSEL).

Figure 3:
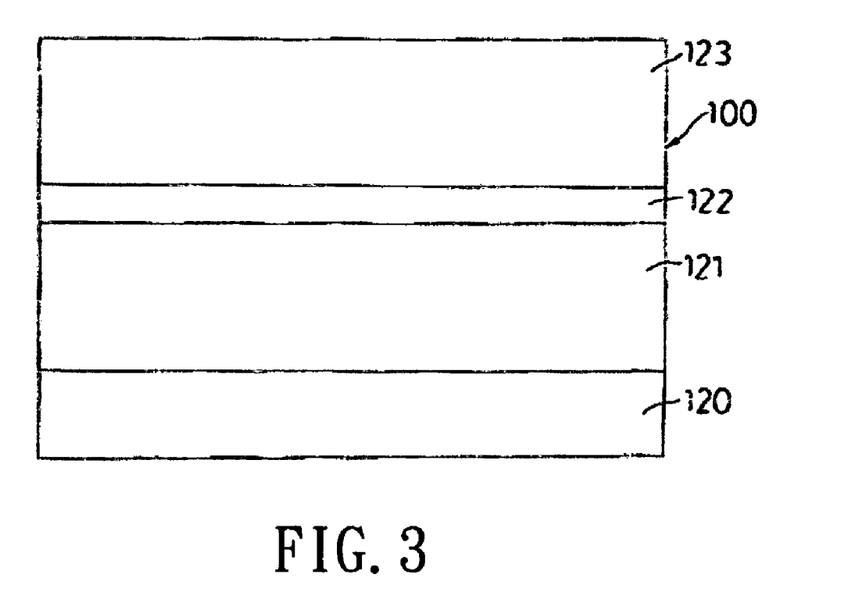
FIG. 3 is a cross-sectional view of a laser chip layer (VCSEL) according to a preferred embodiment of the present invention.

Each step of the foregoing flow chart will be described in detail as follows:

In Step 1 for providing a laser chip layer (VCSEL), the laser chip layer (VCSEL) is provided for producing an oxide confined vertical-cavity surface emitting laser, which is a 3~5 layer expitary laser semiconductor material. In a preferred embodiment as shown in FIG. 3, the laser semiconductor material comprises a substrate 120, a first distributed Bragg reflector 121 grown at a distal surface of the substrate 120 according to a continuous expitary, an active layer (active area) 122 and a second distributed Bragg reflector 123. In the following Steps 2 to 9, the dual platform areas are produced synchronously on the second distributed Bragg reflector 123, so as to obtain a light emitting active area platform 102 and a wire bonding area platform 103 built on the semiconductor structure. Compared with the prior art method of using a dielectric material for the filling as a basis for producing a wire bonding area or its platform, the invention further uses the ion implant process to adjust the capacitance and also obtains a higher mechanical stress for the wire bonding process. The dielectric layer 105 produced at the same time can give a better planarization for producing the protective layer 106 and the metal layer 107.

The substrate 120 of this preferred embodiment is made of an n+ GaAs material; the first distributed Bragg reflector 121 is made of an N-DBRs material; and the second distributed Bragg reflector 123 is made of a P-DBRs material.

Figure 4:
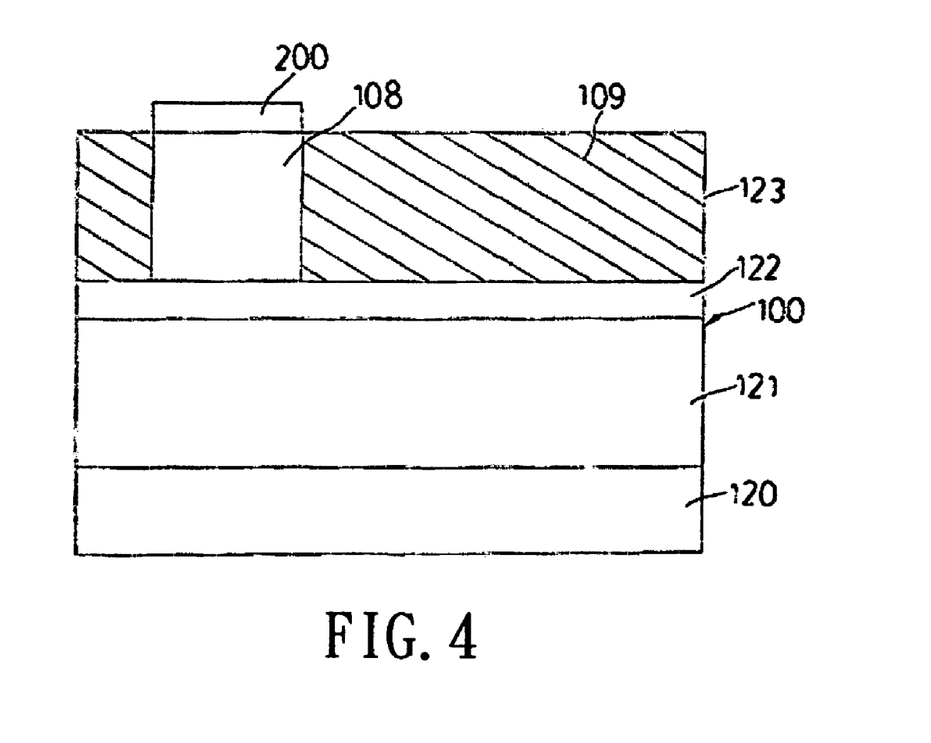
FIG. 4 is a cross-sectional view of a dual platform production area produced on a laser chip layer (VCSEL) according to a preferred embodiment of the present invention.

In Step 2 for defining a dual platform production area on the surface of the laser semiconductor material, a dual platform production area 108, 109 is defined, wherein the first platform producing area 108 produces a first independent platform to work with the following steps of the manufacturing procedure to produce a light emitting active area platform 102; and the second platform producing area 109 produces a second independent platform to work with the following steps of the manufacturing procedure to produce a wire bonding area platform 103. In this step of the manufacturing procedure, the ion implant process is used to ion implant the second platform producing area 109 for producing the wire bonding area platform 103, so as to adjust the capacitance. In other words, the photoresist material is applied to produce a photoresist layer 200 at a distal end of the second distributed Bragg reflector 123 of the laser semiconductor material 1 to cope with the ion implant technology for ion implanting the second distributed Bragg reflector 123 and defining the two platform producing areas 108, 109. In FIG. 4, the first independent platform which has not gone through the ion implant process is used as the light emitting active area platform 102, and the second independent platform that has gone through the ion implant process is used as the wire bonding area platform 103. Further, the capacitance of the wire bonding area platform 103 defined and formed by the ion implant process can be adjusted by the ion implant process.

In other preferred embodiments, Step 1 also can directly provide a laser chip layer (VCSEL) 100 at a distal surface of the second distributed Bragg reflector 123 to carry out Step 3 for producing the light emitting active area platform 102 and the wire bonding area platform 103, and thus skipping Step 2 for defining a dual platform production area 108, 109 on the surface of the laser semiconductor material and omitting the production of a producing area 109 of the wire bonding area platform 103 for carrying out the ion implant process. Such arrangement can lower the manufacturing cost to meet with the low-cost requirement.

Figure 5:
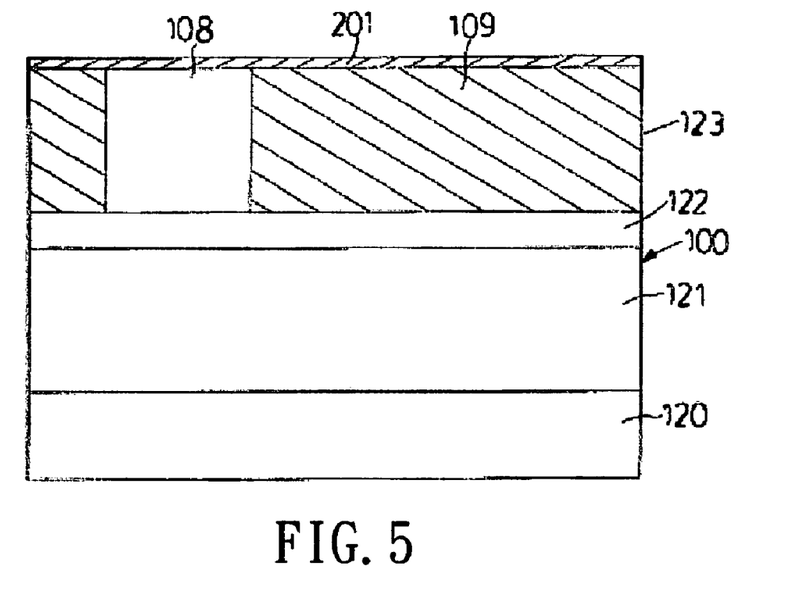
FIG. 5 is a cross-sectional view of a dual platform production area produced on a protective layer according to a preferred embodiment of the present invention.
Figure 6:
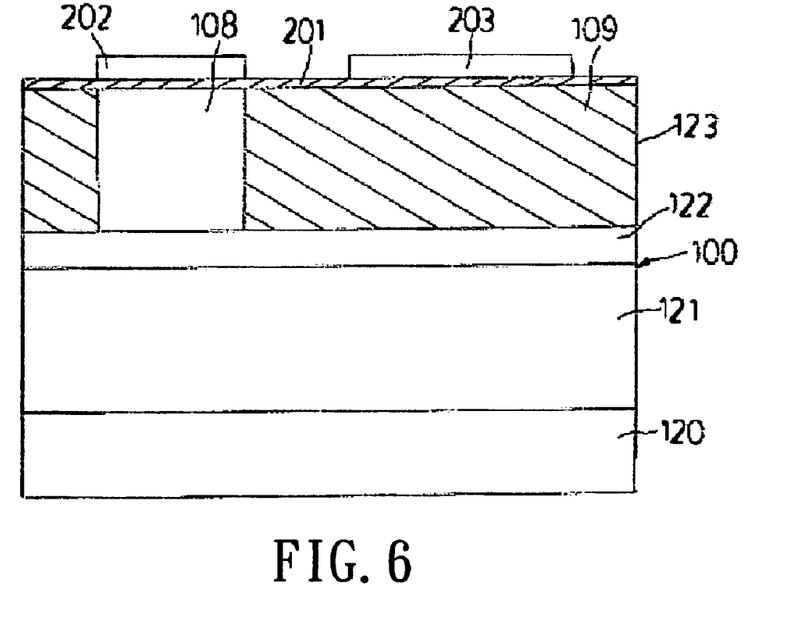
FIG. 6 is a cross-sectional view of a dual platform production area defined in a dual platform area according to a preferred embodiment of the present invention.

In Step 3 for producing a light emitting active area platform and a wire bonding area platform on the dual platform production area, the light emitting active area platform 102 and the wire bonding area platform 103 of the invention respectively and simultaneously produce the two platform producing areas 108, 109 on the laser chip layer (VCSEL) 100 defined in Step 2, and its manufacturing procedure is illustrated in FIGS. 5 to 8. The distal surfaces of two platform producing areas are defined on the laser chip layer (VCSEL) 100, and a protective layer 201 is plated thereon as shown in FIG. 5, and then a photoresist material is used to form a photoresist layer 202, 203 at the distal surfaces of the two platform areas for defining the patterns of the light emitting active area platform 102 and the wire bonding area platform 103 on the two platform producing areas as shown in FIG. 6.

Figure 7:
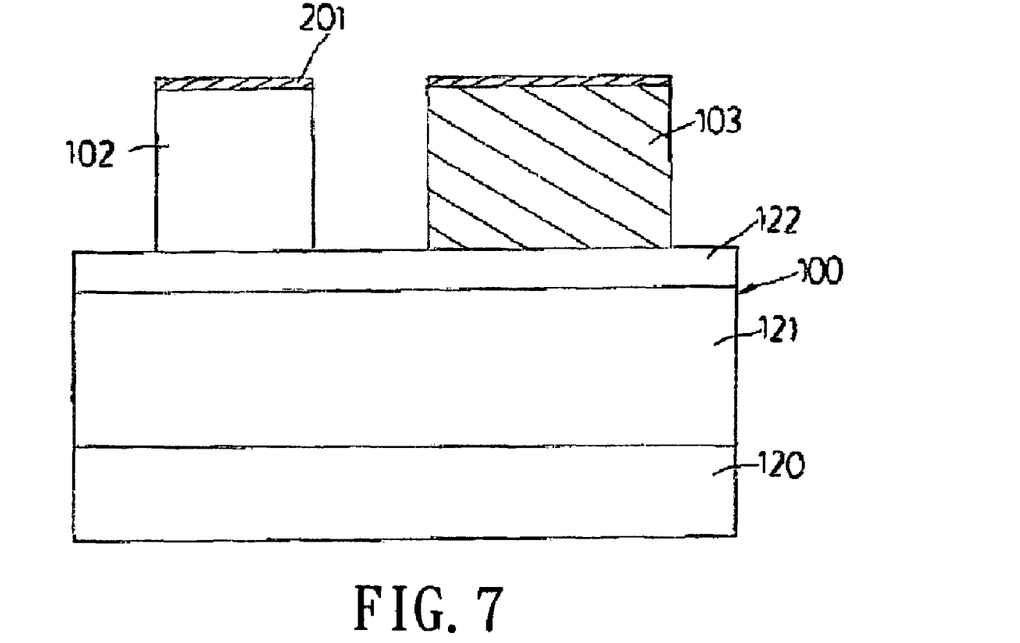
FIG. 7 is a cross-sectional view of producing a dual platform area on a laser chip layer (VCSEL) according to a preferred embodiment of the present invention.
Figure 8:
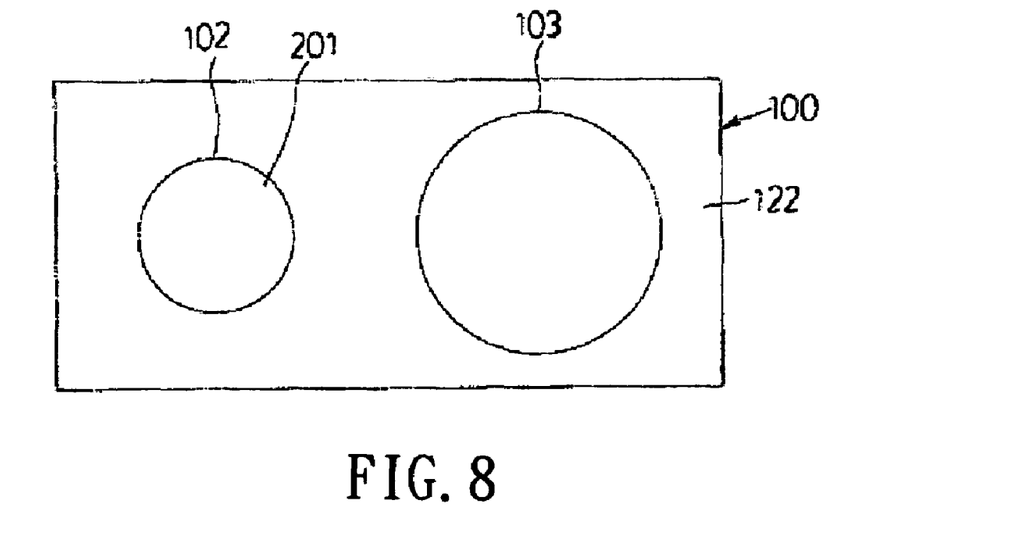
FIG. 8 is a top view of producing a dual platform area on a laser chip layer (VCSEL) according to a preferred embodiment of the present invention.

After the patterns of the light emitting active area platform 102 and the wire bonding area platform 103 are defined, the photoresist layer 202, 203 is removed, and the two platform areas are etched to produce the light emitting active area platform 102 and the wire bonding area platform 103 and build them on a distal surface of the laser chip layer (VCSEL) 100. FIGS. 7 and 8 show the cross-sectional views of the etched dual platform.

In this preferred embodiment of the invention, the protective layer is made of silicon nitride (SiN) or silicon oxide ($SiO_2$), or any other dielectric material defined and coated in form of a film on a distal surface of the dual platform area to form a protective layer. As to the etching process, the preferred embodiment of the invention adopts a wet etching process. However, any other appropriate etching process may be used, since the invention is not limited to the wet etching process.

In other preferred embodiments, the light emitting active area platform 102 and the bonding area platform 103 can set the producing position directly on a distal surface of the second distributed Bragg reflector 123 of a laser chip layer (VCSEL) 100 provided in Step 1, without going through the ion implant process to produce the dual platform production area 108, 109 of the light emitting active area platform 102 and the wire bonding area platform 103. Its manufacturing method is the same as that illustrated in FIGS. 5 to 8. A protective layer 201 is coated by a film plating onto the surface of the laser chip layer (VCSEL) 100 as shown in FIG. 5, and then a photoresist material is used to form a photoresist layer 202, 203 on a distal end of the two platform areas for defining the patterns and the producing positions of the light emitting active area platform 102 and the wire bonding area platform 103 respectively on the two platform producing areas as shown in FIG. 6.

Figure 9:
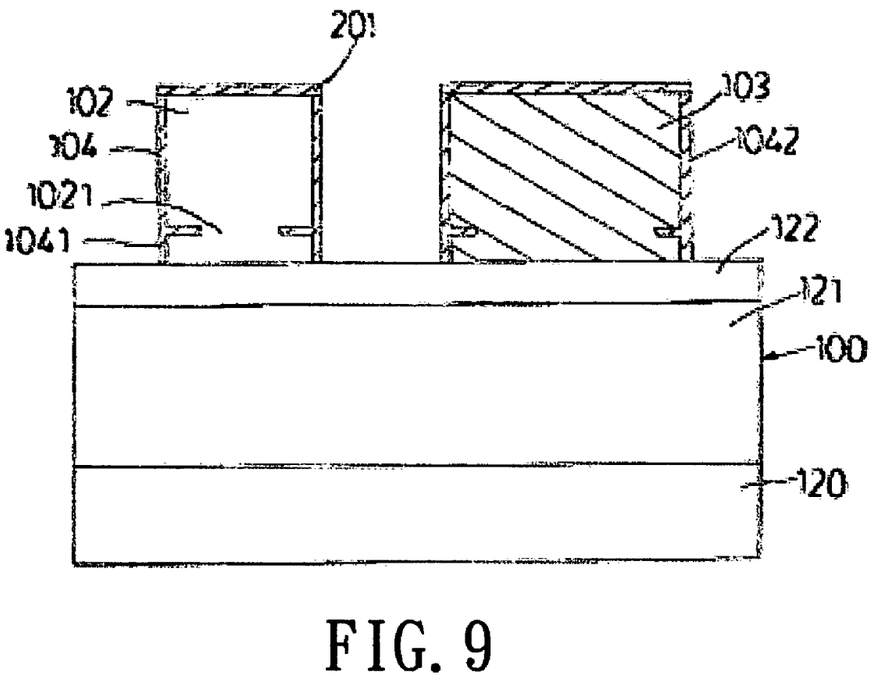
FIG. 9 is a cross-sectional view of producing an oxide layer in a dual platform area according to a preferred embodiment of the present invention.

After the patterns of the light emitting active area platform 102 and the wire bonding area platform 103 are defined, the photoresist layer 202, 203 is removed, and the two platform areas are etched to produce a light emitting active area platform 102 and a wire bonding area platform 103 and also build them on a distal surface of the laser chip layer (VCSEL) 100. FIGS. 7 and 9 show the etched dual platform.

Figure 10:
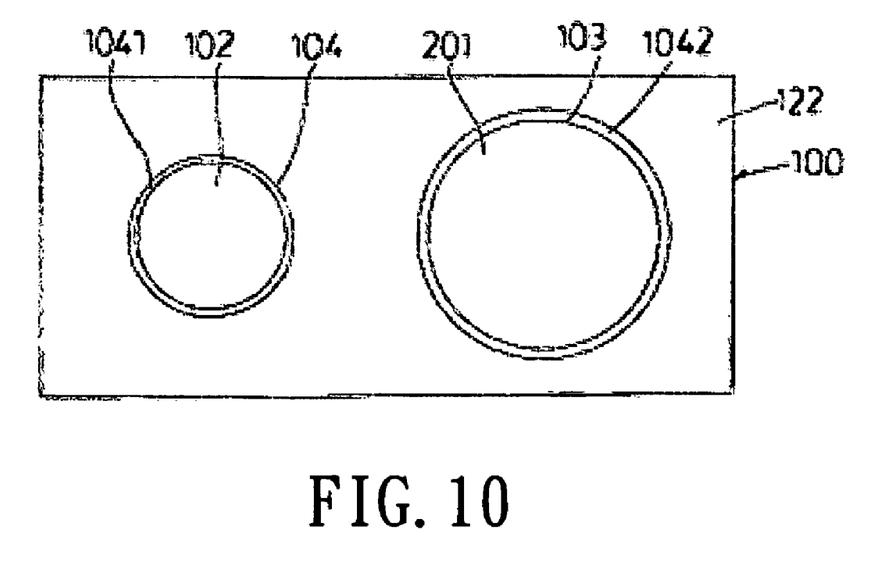
FIG. 10 is a top view of producing an oxide layer in a dual platform area according to a preferred embodiment of the present invention.

In Step 4 for producing a dual platform oxide layer, an oxide layer is produced to form an insulating area, after the light emitting active area platform 102 and the wire bonding area platform 103 are produced, so as to produce the structure of the light emitting active area platform 102 and the wire bonding area platform 103. The manufacturing process and method for producing the oxide layer adopt a standard oxidation process, such as a wet oxidation process. However, such wet oxidation process does not constitute a limitation to the present invention. The oxidation is applied to the peripheries of the light emitting active area platform 102 and the wire bonding area platform 103 to form an insulating oxide layer 1041, 1042 having an oxide confined hole 1021, 1031 in the insulating area, so as to produce the structure of a light emitting active area disposed at the light emitting active area platform 102 and the structure of a wire bonding area of the wire bonding area platform 103 as shown in FIGS. 9 and 10.

In the method according to a preferred embodiment of the present invention, the oxide layer 104 adopts an isolable barrier, preferably an insulating area formed by an oxidizing material through an oxidation process. It is worth to note that the oxide layer 104 could be any isolable barrier containing an isolable material, and the isolable material could be an oxidizing material or a partially oxidizing material.

Figure 11:
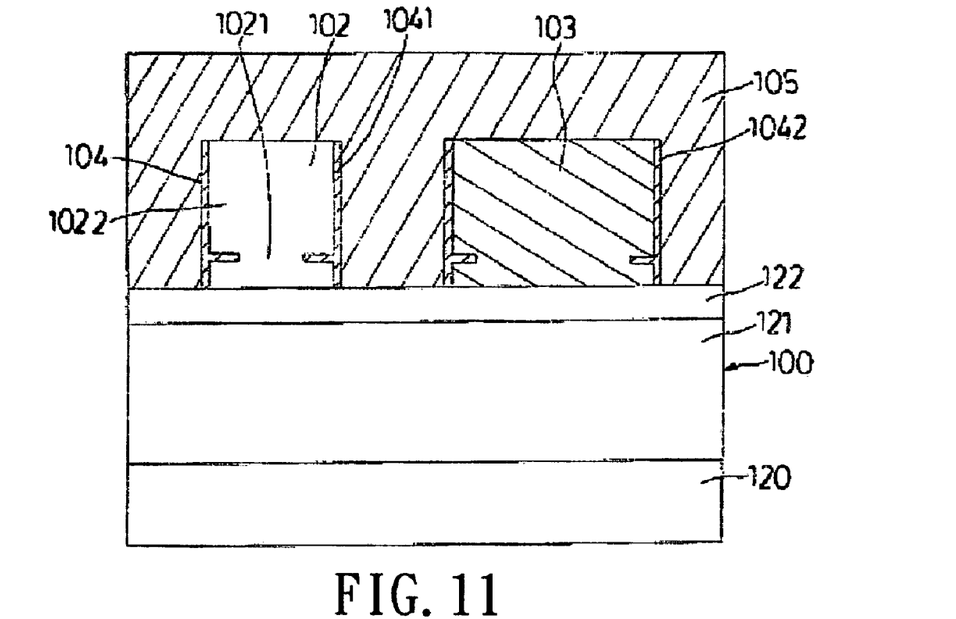
FIG. 11 is a cross-sectional view of producing a dielectric layer in a dual platform area according to a preferred embodiment of the present invention.
Figure 12:
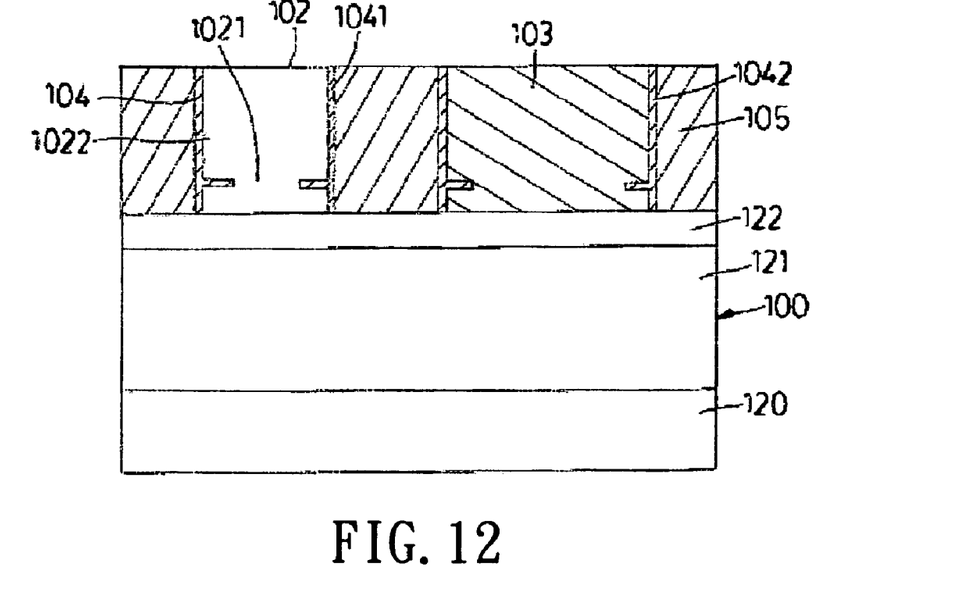
FIG. 12 is a cross-sectional view of obtaining a planarized oxide layer according to a preferred embodiment of the present invention.

In Step 5 for producing a dielectric layer at the peripheries of the light emitting active area platform and the wire bonding area platform, the dielectric layer 105 as shown in FIG. 11 uses a dielectric material such as a polymer material including SOG, BCB, polyimide, or other insulating material to fill the laser chip layer (VCSEL) 100 at the periphery of the light emitting active area platform 102 and the wire bonding area platform 103 to work with the etching process to remove the dielectric material on the light emitting active area platform 102 and the wire bonding area platform 103, so as to obtain a planarized dielectric layer 105 easily to be formed at the peripheries of the light emitting active area platform 102 and the wire bonding area platform 103 as shown in FIG. 12 to facilitate the production of the protective layer 106 and the metal layer 107 taken place at a later step of the manufacturing procedure.

Figure 13:
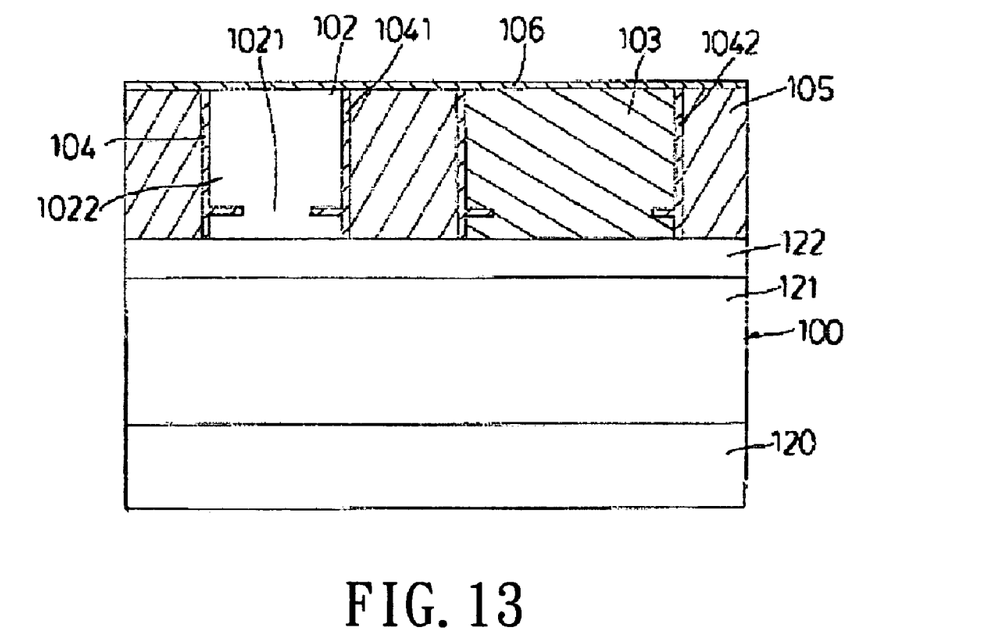
FIG. 13 is a cross-sectional view of producing a protective layer according to a preferred embodiment of the present invention.

In Step 6 for producing a protective layer on the surface of a dielectric layer, the planarized dielectric layer 105 as shown in FIG. 13 is coated directly on the surface of the light emitting active area platform 102 and the wire bonding area platform 103 to produce a protective layer 106 having a protective material plated by a film plating process. The protective layer 106 corresponding to the position of the light emitting active area platform 102 further includes a contact area hole 111 used for contacting the electrodes taken place in the later steps of producing the metal layer 107.

Figure 14:
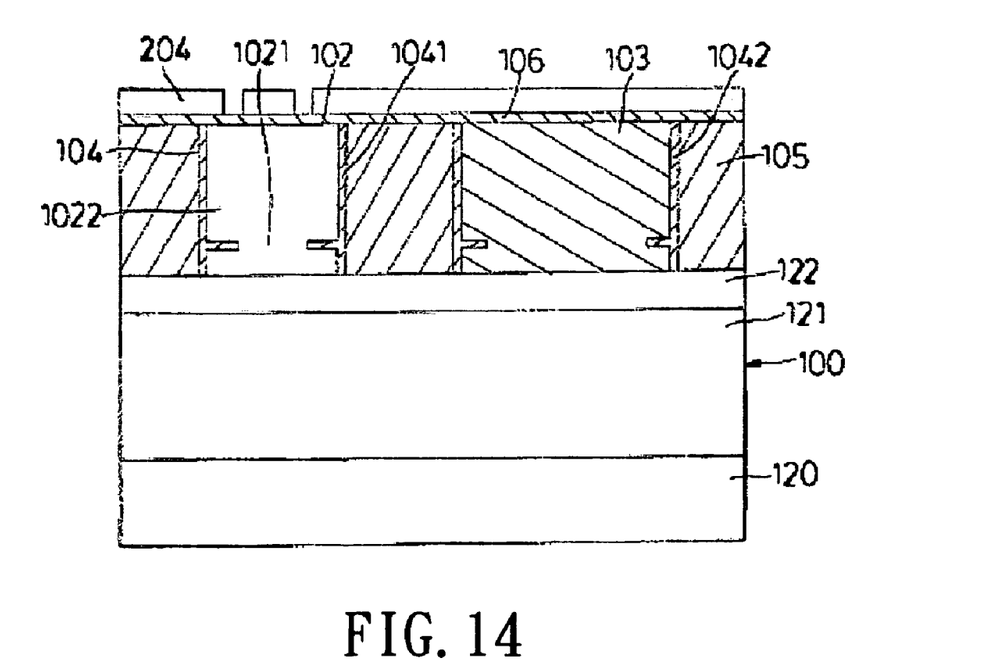
FIG. 14 is a cross-sectional view of producing a contact area hole on a protective layer according to a preferred embodiment of the present invention.
Figure 15:
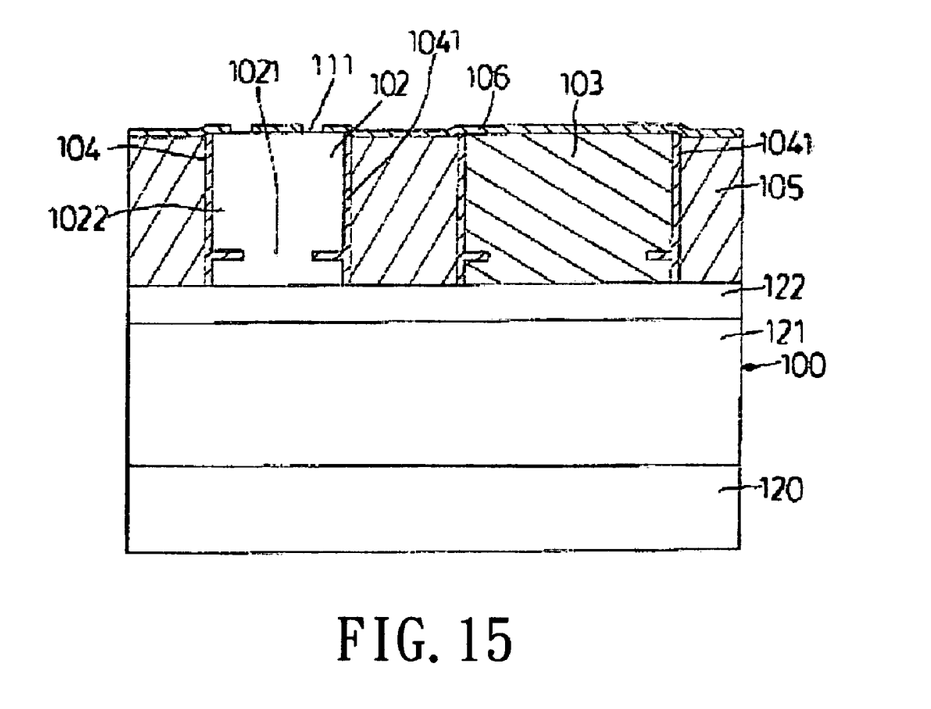
FIG. 15 is a cross-sectional view of producing a protective layer having a contact area hole according to a preferred embodiment of the present invention.
Figure 16:
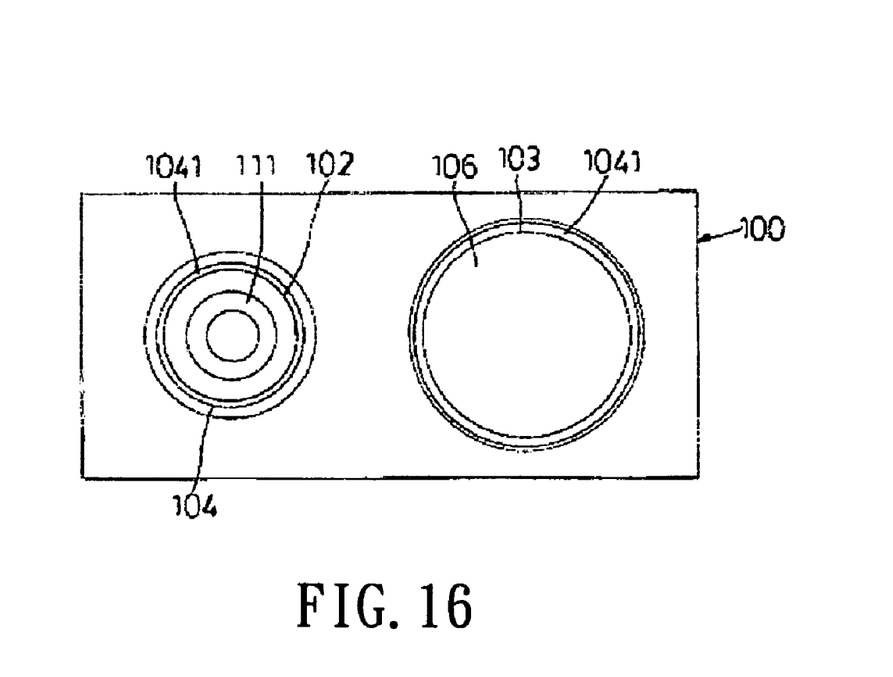
FIG. 16 is a top view of producing a protective layer having a contact area hole according to a preferred embodiment of the present invention.

In the production of the contact area hole 111, a photoresist material is used to produce a photoresist layer 204 on the surface of the protective layer 106 to define the pattern and position of the contact area hole 111 as shown in FIG. 14, and the etching process is used to remove the protective layer 106 in the pattern area. After the photoresist layer 204 is removed, a contact area hole 111 is partially exposed from the surface of the light emitting active area platform 102 as shown in FIG. 15. The contact area hole 111 of the preferred embodiment as shown in FIG. 16 is in a circular shape, and it is worth to point out that other shapes can be used as well.

The protective layer 106 according to the preferred embodiment is a dielectric material such as silicon nitride (SiN) or silicon oxide ($SiO_2$) coated in form of a film layer on the dielectric layer 105 and the surfaces of the light emitting active area platform 102 and the wire bonding area platform 103 to form a non-conducting protective layer.

Figure 17:
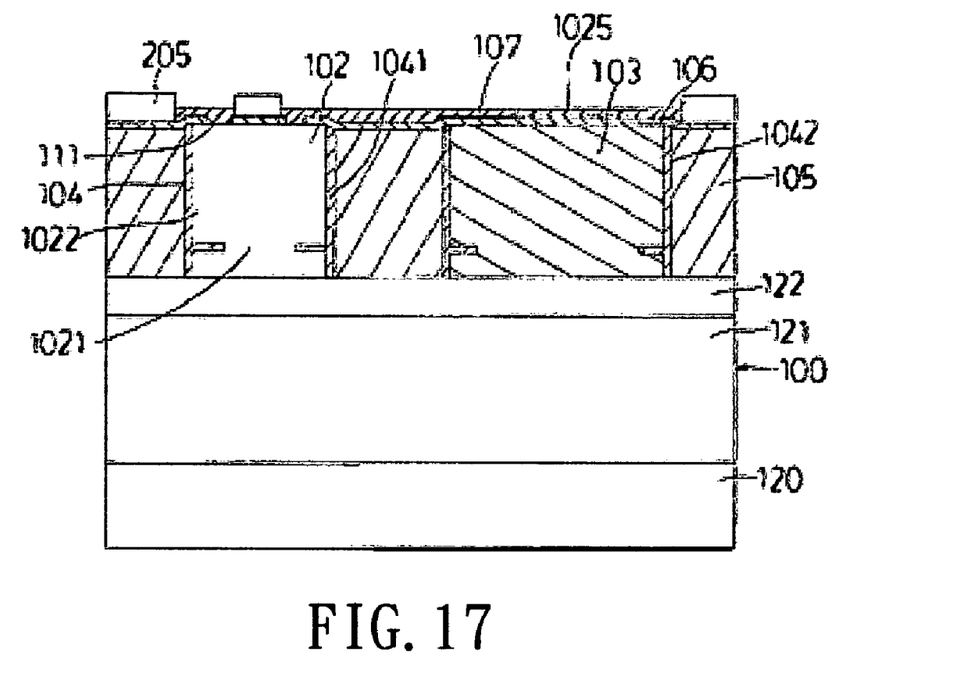
FIG. 17 is a cross-sectional view of producing a metal layer according to a preferred embodiment of the present invention.
Figure 18:
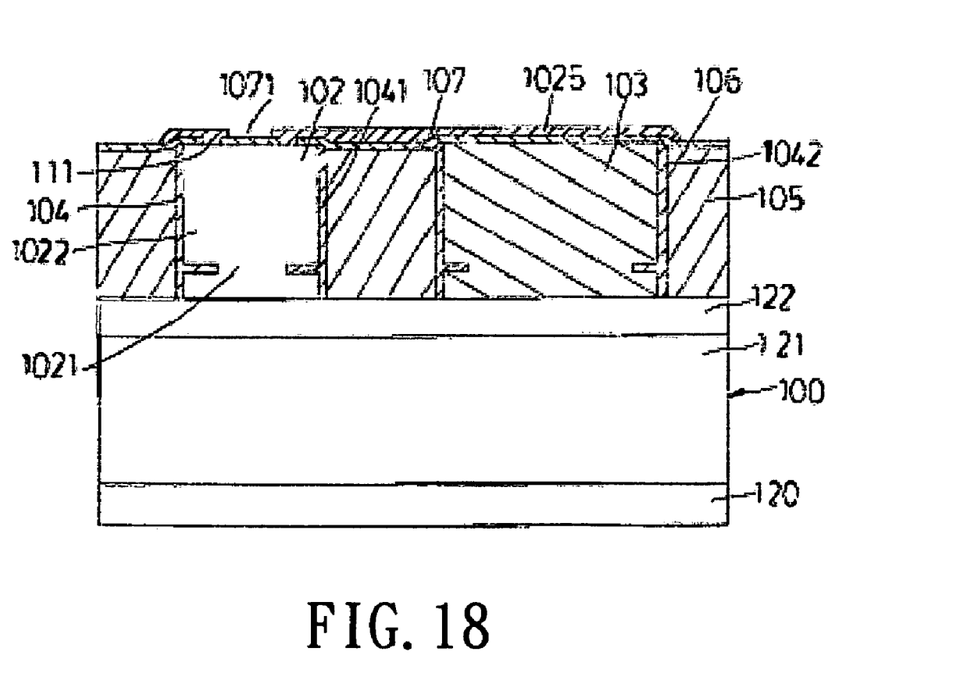
FIG. 18 is a cross-sectional view of completing the production of a metal layer according to a preferred embodiment of the present invention.

In Step 7 for producing a metal layer to form a pad on a light emitting active area platform and disposed at the wire bonding area platform, the wire bonding area of the light emitting active area platform uses the wire bonding area platform 103 as a basis to produce a pad 1025 at the light emitting active area platform 102 for extending and bond wiring. The metal layer 107 is produced, and a photoresist material is used for producing a photoresist layer 205 on the surface of the protective layer 106 to define the pattern of the metal layer. An electrically conductive material such as gold, silver, copper, and other electrically conductive mixture is used to coat a metal film on the surface of the protective layer 106 by a gold plating process as shown in FIG. 17. After the photoresist layer 205 is removed to obtain a metal layer 107, the metal layer 107 includes a light emitting hole 1071 disposed at the light emitting active area platform 102, and the metal layer 107 is penetrated through the contact area hole 111 and coupled to the top surface of the first independent platform 102, and the metal layer 107 is extended to an end of the second independent platform 103 to cope with the area of the wire bonding area platform 10 to produce a P electrode layer pad 1025 of the light emitting active area platform.

The light emitting hole 1071 falls within the contact area hole 111 and corresponds to the oxide confined hole 1021 of the light emitting active area platform 102, so as to correspond to an active layer (active area) of the light producing area 122 to carry out a vertical light emission.

In Step 8 for producing a bottom electrode layer (with a cathode layer), the light emitting active area platform 102 is produced on the laser chip layer (VCSEL) 100 by the foregoing dual platform manufacturing method, and the wire bonding area platform is 103 is used as a platform to form a pad 1025 for wire bonding the light emitting active area platform 102, and then the substrate 120 of the laser chip layer (VCSEL) 100 is cut to an appropriate thickness to produce a bottom electrode layer 101 as shown in FIG. 12. The bottom electrode layer defines a cathode layer to complete the production of the oxide confined dual platform vertical-cavity surface emitting laser (VCSEL) in accordance with the present invention.

What is claimed is:

1. A method for producing an oxide confined semiconductor laser, the method comprising the steps of:
    providing a laser chip layer including a substrate, a first distributed Bragg reflector formed on the substrate, an active layer formed on the first distributed Bragg reflector, and a second distributed Bragg reflector formed on the active layer;
    etching the second distributed Bragg reflector to form a semiconductor structure with a first and a second independent columnar platforms on the active layer;
    producing an oxide layer for the first and the second independent platforms;
    filling a dielectric layer between exteriors of the first and the second independent platforms to obtain a planarized surface;
    producing a protective layer disposed on the planarized surface of the dielectric layer and including a contact area hole corresponding to the first independent platform;
    producing a metal layer on the protective layer to form an area with a plated surface extended from the first independent platform to the second independent platform to serve as a pad for wire bonding the first independent platform; and
    producing a bottom electrode layer at bottom of the laser chip layer to form a cathode, so as to complete a production of an oxide confined dual platform vertical-cavity surface emitting laser (VCSEL).

2. The method of claim 1, further comprising the step of forming a light emitting active area platform etched and formed simultaneously on the first independent platform and a wire bonding area platform of the second independent platform.

3. The method of claim 1, further comprising the step of producing the second distributed Bragg reflector on the laser chip layer to carry out simultaneous production of the first and the second independent platforms to obtain the first independent platform that forms a light emitting active area platform, and the second independent platform that forms the wire bonding area platform.

4. The method of claim 1, wherein the second independent platform etched and formed as a wire bonding area platform goes through an ion implant process before going through etching and producing processes.

5. The method of claim 4, wherein the second independent platform that has gone through the ion implant process further comprises the step of adjusting the capacitance of the second independent platform by using the ion implant process.

6. The method of claim 1, wherein a wire bonding area platform etched and formed on the second independent platform is etched and produced directly by the second distributed Bragg reflector of the laser chip layer.

7. The method of claim 1, wherein the step of producing the first independent platform and the second independent platform further comprising the steps of:
    coating a protective layer on the surface of the second distributed Bragg reflector of the laser chip layer to cope with a photoresist layer disposed on the protective layer to define positions and patterns of the first and the second independent columnar platforms;
    removing the protective layer that has no defined pattern, and removing the photoresist layer;
    using an etching process to simultaneously etch and produce the first and the second independent platforms on the surface of the second distributed Bragg reflector.

8. The method of claim 7, wherein the protective layer is made of silicon nitride (SiN), silicon oxide ($SiO_2$), or a dielectric material in the form of a film coated onto the surface of the second distributed Bragg reflector.

9. The method of claim 1, wherein the oxide layer of the first and the second independent platforms is produced by a process further comprising the steps of using an isolable material to form an insulating oxide layer having an insulating area with an oxide confined hole on the first and the second independent platforms by an oxidation process, producing the structure of a light emitting active area on the first independent platform as the light emitting active area platform and the structure of a wire bonding area platform on the second independent platform as a basis of the wire bonding area.

10. The method of claim 9, wherein the isolable material that forms the oxide layer is made of an oxidizing material or a partially oxidizing material.

11. The method of claim 1, wherein the dielectric layer is produced by a process further comprising the steps of: using a dielectric material to fill the surface of the laser chip layer between the exteriors of the first and the second independent platforms to cope with an etching process to remove the dielectric material on the first and the second independent platforms, so as to obtain a planarized dielectric layer easily.

12. The method of claim 1, wherein the dielectric material of the dielectric layer is made of an insulating material, or a polymer material including a SOG, a BCB, or a polyimide.

13. The method of claim 1, wherein the protective layer produced on the surface of the dielectric layer, a photoresist layer defines pattern and position of the contact area hole on the surface of the protective layer and uses an etching process to remove the protective layer and the photoresist layer in a pattern area to expose a portion as a metal layer contact area of the first independent platform, which is provided for coupling the metal layer.

14. The method of claim 1, wherein the contact area hole of the protective layer is in a circular shape.

15. The method of claim 1, wherein the metal layer is produced on the surface of the protective layer by a process further comprising the steps of using a photoresist layer to define the pattern of a metal layer on the protective layer, using a gold plating process to produce a metal layer, and the metal layer includes a contact area hole on the protective layer and coupled to the first independent platform, and another end of the metal layer is extended to the second independent platform as a basis for forming a pad for wire bonding the first independent platform from the gold plated layer at the surface of the second independent platform.

16. The method of claim 1, wherein the metal layer is made of an electrically conductive material, or an electrically conductive mixture.

17. A method of producing an oxide confined vertical-cavity surface emitting laser including a laser chip layer comprised of a substrate, a first distributed Bragg reflector grown at a distal surface of the substrate according to a continuous expitary, an active layer, and a second distributed Bragg reflector, and the method for producing an oxide confined vertical-cavity surface emitting semiconductor laser by a dual independent platform production area, comprising the steps of:

providing a laser chip layer;

defining a dual platform production area on the surface of the laser chip layer;

producing a light emitting active area platform and a wire bonding area platform on the surface of the laser chip layer;

producing an oxide layer on the walls of the light emitting active area platform and the wire bonding area platform;

producing a planarized dielectric layer at the peripheries of the light emitting active area platform and the wire bonding area platform;

producing a protective layer having a contact area hole on the surface of the dielectric layer;

producing a metal layer at the protective layer to form the light emitting active area platform and using the wire bonding area platform as a base for a pad;

producing a bottom electrode layer at the bottom of the laser chip layer to form a cathode, so as to complete the production of the oxide confined dual platform vertical-cavity surface emitting laser (VCSEL), wherein the light emitting active area platform and the wire bonding area platform are produced by a process further comprising the steps of:

coating a protective layer on the surfaces of the two platform producing areas defined on the laser chip layer, using the photoresist layer to define the patterns of the light emitting active area platform and the wire bonding area platform on the surface of the protective layer in the two platform producing areas;

removing the protective layer that has no defined pattern, and removing the photoresist layer; and using an etching process to produce the light emitting active area platform and the wire bonding area platform respectively on the two platform producing areas and also on the laser chip layer.

18. The method of claim 17, further comprising the steps of producing the second distributed Bragg reflector on the laser chip layer to carry out the simultaneous production of the two dual platform areas to obtain a light emitting active area platform and producing a wire bonding area platform by the semiconductor structure.

19. The method of claim 17, wherein the step of defining the dual platform production area further comprises the steps of using a photoresist layer to define a pattern and a position on the surface of the second distributed Bragg reflector to cope with the ion implant process to form a light emitting active area platform producing area that has not gone through the ion implant process and a wire bonding area platform producing area that has gone through the ion implant process.

20. The method of claim 19, wherein the wire bonding area platform producing area that has gone through the ion implant process further comprising the step of using the ion implant process to adjust the capacitance of the wire bonding area platform producing area.

21. A method for producing an oxide confined vertical-cavity surface emitting laser, comprising the steps of:

providing a laser chip layer including a substrate, a first distributed Bragg reflector formed on the substrate, an active layer formed on the first distributed Bragg reflector, and a second distributed Bragg reflector formed on the active layer;

etching the second distributed Bragg reflector to form a light emitting active area platform and a wire bonding area platform directly on the active layer;

applying the production of an oxide layer on the light emitting active area platform and the wire bonding area platform;

filling a dielectric layer at exteriors of the light emitting active area platform and the wire bonding area platform;

producing protective layer including a contact area hole corresponding to a light emitting active area platform on the dielectric layer;

producing a metal layer on the protective layer to form an area with a gold-plated surface of the light emitting active area platform extended to the wire bonding area platform as a pad used for wire bonding the light emitting active area platform; and producing a bottom electrode layer at bottom of the laser chip layer to form a cathode, and completing the production of the oxide confined dual platform vertical-cavity surface emitting laser (VCSEL).

22. The method of claim 21, wherein the dielectric layer filled at the exteriors of the light emitting active area platform and the wire bonding area platform is to obtain a planarized surface easily to facilitate the production of the protective layer and the metal layer.

23. The method of claim 21, wherein a area having the gold-plated surface used for wire bonding the light emitting active area platform uses an independent wire bonding area platform of the semiconductor structure as a basis for production and thus having a higher wire bonding strength.

* * * * *